United States Patent
Tepman

(10) Patent No.: US 6,881,310 B2
(45) Date of Patent: *Apr. 19, 2005

(54) COOLING SYSTEM FOR MAGNETRON SPUTTERING APPARATUS

(75) Inventor: Avi Tepman, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/655,949

(22) Filed: Sep. 5, 2003

(65) Prior Publication Data

US 2004/0045670 A1 Mar. 11, 2004

Related U.S. Application Data

(63) Continuation of application No. 09/594,198, filed on Jun. 14, 2000, now Pat. No. 6,641,701.

(51) Int. Cl.$^7$ .............................................. C23C 14/35
(52) U.S. Cl. ................................ 204/298.09; 204/298.2
(58) Field of Search ........................ 204/298.09, 298.2, 204/298.22

(56) References Cited

U.S. PATENT DOCUMENTS

| | | | | |
|---|---|---|---|---|
| 4,746,417 A | * | 5/1988 | Ferenbach et al. | 204/298.2 |
| 5,171,415 A | * | 12/1992 | Miller et al. | 204/298.09 |
| 5,200,049 A | | 4/1993 | Stevenson et al. | 204/298.22 |
| 5,953,827 A | | 9/1999 | Or et al. | 34/58 |
| 6,641,701 B1 | * | 11/2003 | Tepman | 204/192.1 |

FOREIGN PATENT DOCUMENTS

JP          59-215484          12/1984          ........... C23C/15/00

OTHER PUBLICATIONS

"High Pressure/Low Torque Water Union, " Data Sheet, *Deublin Company*, Model 927, pp. 1.

* cited by examiner

Primary Examiner—Rodney G. McDonald
(74) Attorney, Agent, or Firm—Moser, Patterson & Sheridan LLP

(57) ABSTRACT

Apparatus and method for cooling a magnetron sputtering apparatus. More particularly, a system including a stationary conduit, a hollow drive shaft rotatably coupled to the stationary conduit, and a magnetron coupled to the hollow drive shaft.

20 Claims, 3 Drawing Sheets

COOLING SYSTEM FOR MAGNETRON SPUTTERING APPARATUS

RELATED APPLICATIONS

This application is a continuation of U.S. patent application Ser. No. 09/594,198, filed Jun. 14, 2000, now U.S. Pat. No. 6,641,701 which is herein incorporated by reference. This application is also related to U.S. Pat. No. 6,207,026, issued Mar. 27, 2001, entitled, "Magnetron with Cooling System for Process Chamber of Processing System", which is commonly owned by the assignee of the present invention.

BACKGROUND OF THE DISCLOSURE

1. Field of the Invention

The invention generally relates to substrate processing systems and, more particularly, to a cooling system for a magnetron sputtering apparatus.

2. Description of the Background Art

A physical vapor deposition chamber (also known as a sputtering chamber) comprises a vacuum chamber containing a pedestal for supporting a substrate, a vacuum pump for evacuating the chamber, a sputtering target, a gas source, and a power source. To enhance the sputtering efficiency and improve target utilization, a planar magnetron system is coupled to the sputtering target. The planar magnetron system may comprise a rotating magnetron disposed behind the target, opposite the surface to be sputtered. The chamber uses either a DC bias between the target and the substrate and/or an RF source coupled to an antenna surrounding the space between the target and the substrate to form a plasma in the chamber.

The magnetron comprises a magnet assembly that provides a magnetic field near the sputtering surface of the target. A negative bias voltage between the target and the plasma region accelerates ions toward the target to dislodge target material therefrom. The magnetic field produced by the magnetron confines free electrons, including secondary electrons displaced from the target material, near the target to maximize ionizing collisions of the free electrons with the sputtered material and maximize ionization of the plasma gas that is near the target.

The magnet assembly comprises one or more magnets that rotate around the backside, i.e., the nonsputtered surface, of the target, to evenly distribute the magnetic field across the sputtering surface of the target to result in uniform sputtering of the target material. Typically, a motor assembly mounted to the magnet assembly imparts rotational motion to the magnet assembly by rotating a drive shaft coupled to the magnet assembly.

The above described magnetron sputtering process, including the effect of the bias voltage and the magnetic fields, causes a considerable amount of energy to be dissipated by the target and the magnetron, thereby tending to heat the target and the magnetron. Heating of the magnetron and/or the target above a designated processing temperature may adversely affect performance of the process by changing the sputtering rate or reducing sputtering uniformity of the target. Additionally, excess heat may shorten the useful lives of the magnetron and the target and cause mechanical features of the magnetron to wear out prematurely. Furthermore, excess heat may cause thermal expansion of components within the chamber, which can cause closely spaced components, such as the target and the magnetron, to physically interfere with one another.

To alleviate this problem, the magnetron is typically housed in a cooling cavity. A coolant, such as deionized water or ethylene glycol, is flowed through the cooling cavity to cool the backside of the target and to cool the magnetron. However, it is difficult to cool the central area of the backside of the target and a region of the magnetron about the rotational central axis of the magnetron. Centrifugal force generated by the rotational movement of the magnetron tends to force coolant away from the rotational center of the magnetron and away from the central area of the backside of the target. In addition, typically, the presence of a motor assembly above the target and the magnetron further complicates the design of a coolant delivery system that delivers coolant to the central area of the backside of the target and to a region of the magnetron about the rotational axis of the magnetron.

Therefore, a need exists in the art for an improved cooling system for a magnetron sputtering apparatus.

SUMMARY OF THE INVENTION

One aspect of the present invention generally provides apparatus for cooling a magnetron sputtering apparatus, comprising a stationary conduit, a hollow drive shaft rotatably coupled to the stationary conduit, and a magnetron coupled to the hollow drive shaft. In another aspect, the invention provides a processing chamber comprising a chamber, a substrate support member disposed within the chamber, a stationary conduit, a hollow drive shaft rotatably coupled to the stationary conduit, and a magnetron coupled to the hollow drive shaft.

In another aspect, the invention provides a method for cooling a magnetron sputtering apparatus that flows coolant from a stationary conduit into a first end of a hollow drive shaft rotatably coupled to the stationary conduit, and flows the coolant from the first end of the hollow drive shaft to a second end of the hollow drive shaft that is proximate a portion of a target assembly.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention generally provides a cooling system for a magnetron sputtering apparatus comprising a stationary conduit, a hollow drive shaft rotatably coupled to the stationary conduit, and a magnetron coupled to the hollow drive shaft.

Figure 1:
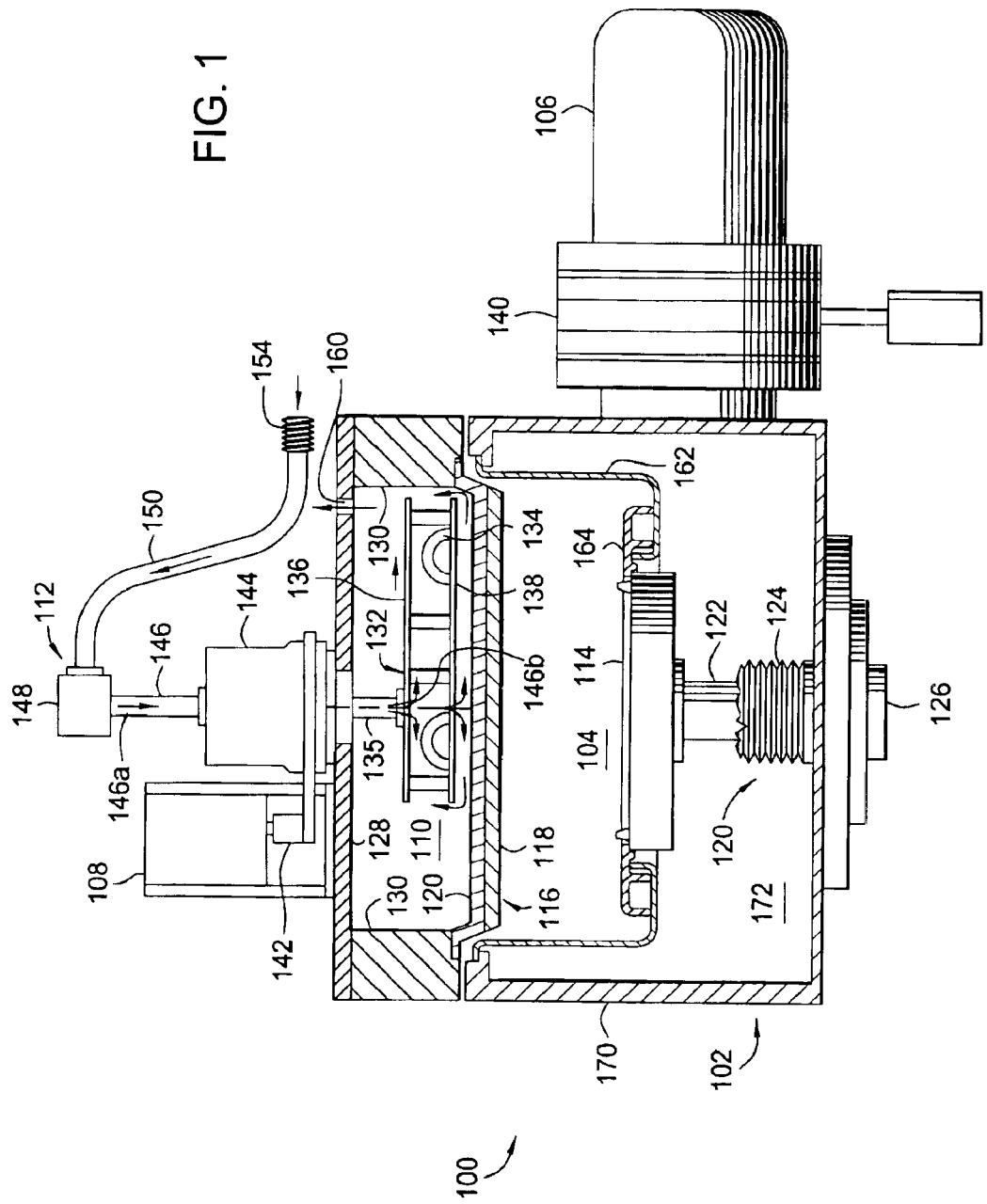
FIG. 1 shows a schematic side view of one embodiment of a process chamber according to the present invention.

FIG. 1 depicts a schematic side view of one embodiment of a process chamber 100 according to the present invention. The invention is useful with process chambers configured with a substrate support member and process environment above, to the side of, or below the target, and indications involving direction such as up, down, top, bottom, backside, etc. are only references used to indicate the position of various members with respect to each other and are not meant to limit the invention.

Generally, the PVD chamber 100 includes chamber walls 102 enclosing a processing region 104, a pump assembly 106, a motor assembly 108, a cooling cavity 110, a magnetron 132 disposed in the cooling cavity 110, and a coolant delivery system 112. A substrate support member 114 is disposed within the processing region 104 for receiving a substrate (not shown). The substrate support member 114 may heat the substrate if required by a process being performed.

A sputtering target assembly 116, including a target 118 and a target backing plate 120 which defines the backside of the target assembly 116, is disposed at the top of the processing region 104. The invention also contemplates other embodiments of the sputtering target assembly, such as a sputtering target assembly consisting of a target without a backing plate.

A lift mechanism 120, including a guide rod 122, a bellows 124, and a lift actuator 126 mounted to the bottom of the PVD chamber 100, raises the substrate support member 114 to perform a process and lowers the substrate support member 114 to exchange substrates. The target 118 provides material such as aluminum, copper, titanium, or tungsten and corresponding nitrides, to be sputtered onto a substrate.

The cooling cavity 110 is situated above and sealed from the processing region 104. The cooling cavity 110 is defined by a top 128, sides 130, and the target backing plate 120.

A rotating magnetron 132 is disposed in the cooling cavity 110 a short distance from the target backing plate 120. The magnetron 132 can have a variety of shapes depending on the material to be deposited and the process conditions, and may be asymmetrical about a rotational axis 135. The magnetron 132 has a set of magnets 134 arranged within the magnetron 132 so that they create a magnetic field that moves across the sputtering surface of the target 118 as the magnetron 132 is rotated. The magnets 134 are secured between a plate 136 defining a first surface of the magnetron 132 and a magnet retainer 138 defining a second surface. The magnetron 132 is situated proximate the backside (i.e., nonsputtered side) of the target assembly 116 defined by the target backing plate 120 with a gap therebetween of about one millimeter to about five millimeters, and preferably about two millimeters to about three millimeters.

The pump assembly 106 typically includes a cryogenic pump, or other high vacuum pump, for pumping the PVD chamber 100 to a very high vacuum for substrate processing. A gate valve 140 is disposed between the pump assembly 106 and the processing region 104 to provide access therebetween so that the pump assembly 106 can lower the pressure in the processing region 104, and to provide isolation therebetween so that the processing region 104 may be vented.

A set of shields 162, 164 disposed within the processing region 104 surround the substrate support member 114 and the substrate during processing in order to prevent target material from depositing on the edge of the substrate and on other surfaces inside the processing region 104. A negative DC bias voltage of about 200 V or more is typically applied to the target 118, and a ground is applied to an anode, the substrate support member 114, and chamber surfaces. The combined action of the DC bias and the rotating magnetron 132 generates an ionized plasma discharge in a process gas, such as argon, between the target 118 and the substrate. The positively charged ions of the plasma are attracted to the target 118 and strike the target 118 with sufficient energy to dislodge atoms of the target material, which sputters onto the substrate.

The motor assembly 108 and the coolant delivery system 112, respectively, are mounted to the top 128 of the cooling cavity 110. The motor assembly 108 comprises a motor pulley 142. Generally, the coolant delivery system 112 comprises a coolant delivery system pulley 144, stationary housing 148, and tubing (a conduit) 150. Stationary housing 148 sealably couples the tubing 150 to the hollow drive shaft 146, allowing coolant to flow therebetween while the hollow drive shaft 146 rotates with respect to the tubing 150, which remains stationary. The coolant delivery system pulley 144 comprises a hollow drive shaft 146. The hollow drive shaft 146 is coupled to the magnetron 132. The motor pulley 142 is coupled to the coolant delivery system pulley 142 by drive belt 152.

The motor assembly 108 imparts rotational motion to the motor pulley 142 that, via drive belt 152, imparts rotational motion to the coolant system pulley 144, which imparts rotational motion to the hollow drive shaft 146. The hollow drive shaft 146, in turn, imparts rotational motion to the magnetron 132 to cause the magnetron 132 to spin from about 80 revolutions per minute (rpm) to about 200 rpm and preferably about 100 rpm during performance of a process.

Coolant, such as deionized water or ethylene glycol, is flowed into inlet 154 of the tubing 150, which extends into the stationary housing 148, then from the tubing 150 through the hollow drive shaft 146. The coolant is delivered to a first end 146A of the hollow shaft 146 at a rate of about one gallon per minute (gpm) to about ten gpm, preferably about three gpm. Coolant is thereby delivered from a second end 146B of the hollow shaft 146 to a central area of the target backing plate 120 that constitutes the backside (i.e., non-sputtered side) of the target assembly 116, as well as to a region of the magnetron about a rotational axis 135 of the magnetron 132.

Centrifugal force generated by the rotational motion of the magnetron 132 causes coolant to flow away from the rotational axis 135 of the magnetron 132 and away from a central area of the backside of the target assembly 116 defined by the target backing plate 120. Coolant flows away from the rotational axis 135 of the magnetron 132, in the region between the target backing plate 120 and the magnet retainer 138 of the magnetron 132, as well as within the magnetron 132, and eventually out of the cooling cavity 110 through outlet 160. The coolant is then circulated through a heat exchanger (not shown) to remove heat from the coolant and then recirculated through the cooling cavity 110.

Figure 2:
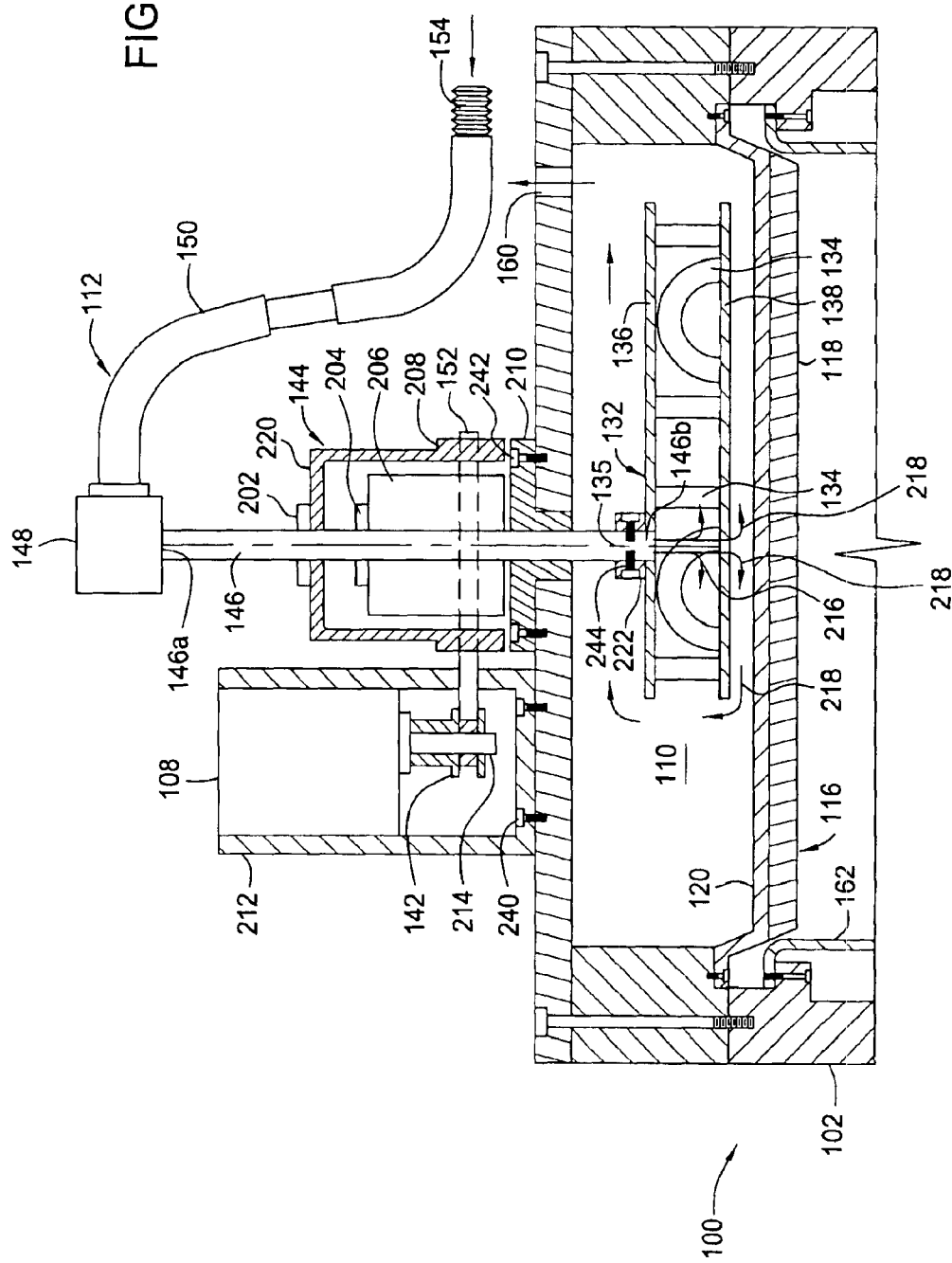
FIG. 2 shows a partial cross-sectional view of an upper portion of the process chamber of FIG. 1.

FIG. 2 depicts a partial cross-sectional view of an upper portion of the process chamber 100 of FIG. 1. Depicted are a portion of the chamber walls 102, the motor assembly 108, the coolant delivery system 112, and the cooling cavity 110, including the magnetron 132 and the target assembly 116 disposed within the cooling cavity 110.

The motor assembly 108 is mounted to the top 128 of the cooling cavity 110 by fasteners such as screws 240, 242.

The cooling system pulley 144 comprises pulley housing 220 and bearing housing 206. The pulley housing 220 comprises drive portion 208, which contacts drive belt 152. Coupling devices such as locknuts 202, 204 fix the hollow drive shaft 146 to the pulley housing 220, so that rotation of the pulley housing 220 causes rotation of the hollow drive shaft 146. The hollow drive shaft 146 and the pulley housing 220 may also be coupled by other methods known in the art, such as keyways, adhesives or lock rings.

Transition pieces such as the flanges 210, 222 comprising fasteners such as screws 242, 244, couple, respectively, the hollow drive shaft 146 to the top of the cooling cavity 110 and the hollow drive shaft 146 to the plate 132 of the magnetron 132. A seal 318 is provided between the rotating hollow drive shaft 146 and the stationary flange 210 to prevent fluid from passing through the flange 210 from the cooling cavity 110 and into the bearing housing 206.

The motor assembly 108 imparts rotational motion to a motor drive shaft 214, which rotates the motor pulley 142, which rotates the drive belt 152. In turn, the drive belt 152, being in contact with the drive portion 208 of the pulley housing 220, imparts rotational motion to the coolant system pulley 144 including the hollow drive shaft 146. The hollow drive shaft 146, in turn, imparts rotational motion to the magnetron 132.

The stationary housing 148 allows the tubing 150 to remain stationary while hollow drive shaft 146 rotates, while maintaining a fluid seal between the tubing 150 and the hollow drive shaft 146. As such, coolant flows from the stationary tubing 150 into the first end 146A of the hollow drive shaft 146.

Coolant flows from the second end 146B of the hollow drive shaft 146 into the coolant cavity 110 as shown by flow arrows 216, 218 into a region about (i.e., including and surrounding) the rotational axis 135 of the hollow drive shaft 146, and then the coolant flows away therefrom due to centrifugal force generated by the rotational motion of the magnetron 132. The coolant ultimately exits the cooling cavity 110 through outlet 160. A portion of the coolant is delivered between magnet retainer 138 and target backing plate 120, to a central area of the target backing plate 120, as shown by arrows 218, and a portion of the coolant is delivered between the plate 136 and the magnet retainer 138 of the magnetron 132, to a region of the magnetron 132 about the rotational axis of the magnetron 135.

Figure 3:
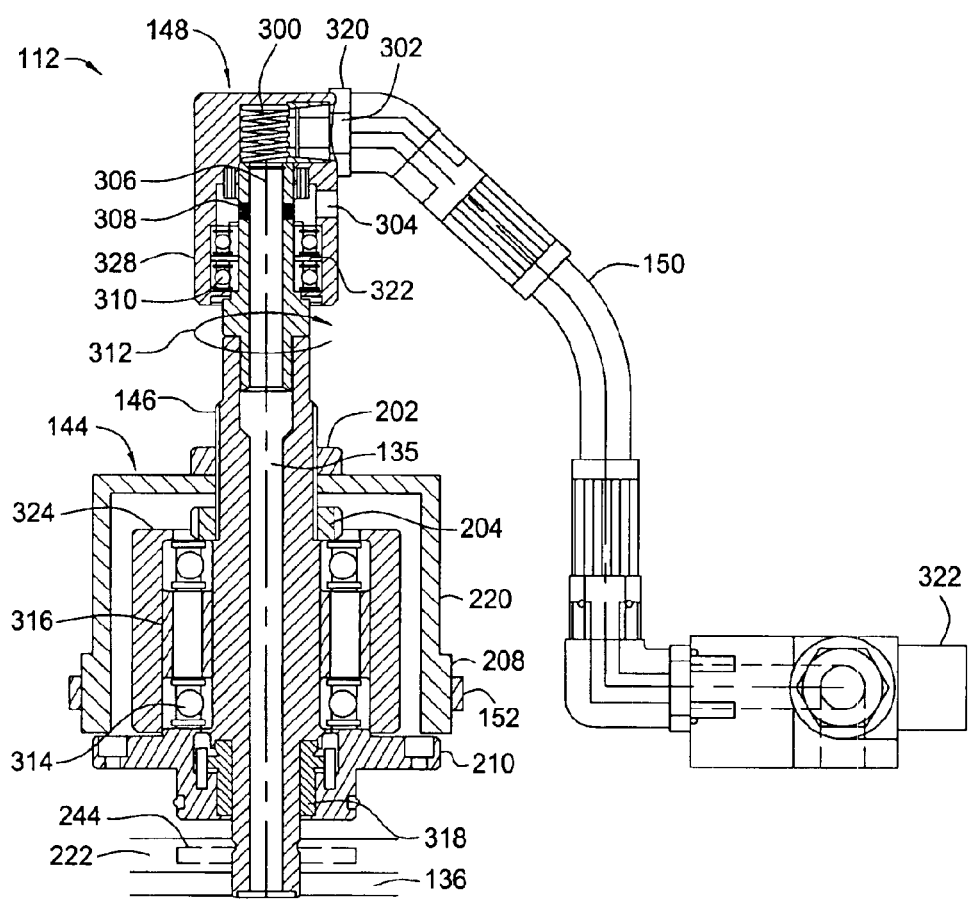
FIG. 3 shows a cross-sectional view of the coolant delivery system of FIGS. 1 and 2.

FIG. 3 depicts a cross-sectional view of the coolant delivery system 112 of FIGS. 1 and 2. The tubing 150, a portion of which extends into stationary housing 148, comprises coolant inlet 302, through which coolant flows into the tubing 150, stationary housing inlet 320, through which coolant flows from the tubing 150 into the hollow drive shaft 146 within the stationary housing 148.

The stationary housing 148 comprises a bias member such as a spring 300 and a rotary seal 308 to sealably couple the tubing 150 and the hollow drive shaft 146. One stationary housing mechanism that can be used with the invention is the Deublin Model 927 Union, available from Deublin Company. The rotary seal 308 defines the boundary between the tubing 150, which remains stationary, and the rotating hollow drive shaft 146. Vent port 304 prevents formation of a pressure differential at the rotary seal 308.

Bearing sets 310, 314 are contained respectively within bearing housings 328, 324 and bearings within each bearing set 310, 314 are separated, respectively, by spacers 322, 316. Fasteners such as locknuts 202, 204 couple the hollow drive shaft 146 to the pulley housing 220, so that the pulley housing 220 imparts rotational motion to the hollow drive shaft 146 when the pulley housing 220 is rotated by drive belt 152 which contacts the drive portion 208 of the pulley housing 220. The bearing sets 310, 314 assist in preventing friction between, and resulting wear of, various members within the coolant delivery system 112. Arrow 312 shows the rotation of the hollow drive shaft 146 about the rotational axis 135 of the magnetron.

Although various embodiments which incorporate the teachings of the present invention have been shown and described in detail herein, those skilled in the art can readily devise many other varied embodiments that still incorporate these teachings.

What is claimed is:

1. Apparatus for cooling a magnetron, comprising:
    a target assembly;
    a cooling cavity having an outlet port disposed therein;
    a magnetron disposed in the cooling cavity in a spaced-apart relation to the target assembly;
    a stationary conduit;
    a rotary union having a stationary housing coupled to the stationary conduit; and
    a hollow drive shaft having a first end coupled to the stationary housing of the rotary union by a spring and having a second end coupled to the magnetron, wherein a flowpath is defined extending co-axially from the second end of the hollow drive shaft to a portion of a target assembly.

2. A processing chamber comprising:
    a target assembly;
    a cooling cavity having an outlet port disposed therein;
    a magnetron disposed in the cooling cavity in a spaced-apart relation to the target assembly;
    a stationary conduit;
    a rotary union coupled to the stationary conduit;
    a hollow drive shaft coupled at a first end to the stationary conduit by the rotary union and having a second end coupled to the magnetron, wherein a flowpath is defined extending co-axially from the second end of the hollow drive shalt to a portion of a target assembly; and
    a seal interfacing with the hollow drive shaft proximate the second end.

3. The processing chamber of claim 2 further comprising a flange coupled to the cooling cavity and having the hollow drive shaft disposed therethrough, the seal disposed between the hollow drive shaft and the flange.

4. The processing chamber of claim 3 further comprising a bearing assembly coupled between the flange and the hollow drive shaft.

5. The processing chamber of claim 4, wherein the seal prevents fluid from passing from the cooling cavity to the bearing assembly along an exterior of the hollow drive shaft.

6. The processing chamber of claim 2, wherein the hollow drive shaft delivers coolant about a rotational axis of the magnetron.

7. The processing chamber of claim 6, wherein the hollow drive shaft delivers coolant about a rotational axis of the magnetron to a central area of a sputtering target assembly.

8. The processing chamber of claim 2, wherein the hollow drive shaft delivers coolant about a rotational axis of the magnetron to a central area of a sputtering target assembly and to a region of the magnetron about the rotational axis of the magnetron.

9. A processing chamber comprising:
    a target assembly
    a cooling cavity having an outlet port disposed therein;
    a magnetron disposed in the cooling cavity in a spaced-apart relation to the target assembly;
    a stationary conduit;
    a rotary union coupled to the stationary conduit;
    a hollow drive shaft coupled at a first end to the stationary conduit by the rotary union and having a second end coupled to the magnetron, wherein a flowpath is defined extending co-axially from the second end of the hollow drive shaft to a portion of a target assembly;
    a bearing assembly engaged with the hollow drive shaft; and a seal for isolating the bearing assembly from the cooling cavity.

10. The processing chamber of claim 9, wherein the seal engages the exterior of the hollow drive shaft proximate the cooling cavity.

11. The processing chamber of claim 9 further comprising a motor assembly for imparting rotational motion to the magnetron.

12. An apparatus for cooling a magnetron, comprising:

a chamber;

a substrate support member disposed within the chamber;

a stationary conduit;

a hollow drive shaft rotatably coupled to the stationary conduit and having at least a portion of a flowpath defined therein, the flowpath extending co-axially from the hollow drive shaft to a portion of a target assembly;

a magnetron coupled to the hollow drive shaft and maintained in a spaced-apart relation to the target assembly;

a cooling cavity surrounding the magnetron and having an outlet disposed therein, the flowpath extending from the center portion between the magnetron and target assembly to the outlet; and a bearing assembly engaged with the hollow drive shaft; and a seal for isolating the bearing assembly from the cooling cavity.

13. The processing chamber of claim 12, wherein the seal engages the exterior of the hollow drive shaft proximate the cooling cavity.

14. The processing chamber of claim 13, wherein the processing chamber comprises a physical vapor deposition chamber.

15. The processing chamber of claim 12 further comprising a motor assembly interfaced with the bearing assembly and coupled to the hollow drive shaft for imparting rotational motion to the magnetron.

16. Apparatus for cooling a magnetron, comprising:

a stationary conduit;

a rotary union coupled to the stationary conduit;

a flange for mounting to a cooling cavity housing a magnetron;

a hollow drive shaft coupled at a first end to the stationary conduit by the rotary union and having a second end extending through the flange for coupling to the magnetron;

a bearing assembly engaged with the hollow drive shaft to facilitate rotation of the shaft relative the mounting flange; and a seal disposed between the hollow drive shaft and the flange.

17. The processing chamber of claim 16, wherein the seal engages the exterior of the hollow drive shaft.

18. The processing chamber of claim 17 further comprising a motor assembly interfaced with the bearing assembly and coupled to the hollow drive shaft for imparting rotational motion to the shaft.

19. The processing chamber of claim 18, wherein the motor assembly further comprises:

a cylindrical section engaging an exterior portion of the bearing assembly and adapted to engage a drive belt; and a top section coupling the cylindrical section to the hollow drive shaft.

20. The processing charmer of claim 16, wherein a flowpath is defined extending co-axially from the second end of the hollow drive shaft.

* * * * *